United States Patent [19]

Hathaway

[11] Patent Number: 4,916,627
[45] Date of Patent: Apr. 10, 1990

[54] LOGIC PATH LENGTH REDUCTION USING BOOLEAN MINIMIZATION

[75] Inventor: David J. Hathaway, Richmond, Vt.

[73] Assignee: International Business Machines Corporation, Armonk, N.Y.

[21] Appl. No.: 127,323

[22] Filed: Dec. 2, 1987

[51] Int. Cl.⁴ .............................................. G06F 15/60
[52] U.S. Cl. ..................................... 364/490; 364/489; 364/488
[58] Field of Search ............... 364/488, 489, 490, 491, 364/300, 578

[56] References Cited

U.S. PATENT DOCUMENTS

| | | | |
|---|---|---|---|
| T. 938,005 | 9/1975 | Colton et al. | 364/490 |
| T. 940,008 | 11/1975 | Oden et al. | 444/1 |
| T. 940,013 | 11/1975 | Ho | 444/1 |
| T. 940,020 | 11/1975 | Brechling et al. | 364/491 |
| T. 943,001 | 2/1976 | Mennone | 444/1 |
| T. 944,001 | 3/1976 | Hanan et al. | 444/1 |
| 3,093,751 | 6/1963 | Williamson | 307/471 |
| 3,622,762 | 11/1971 | Dyer | 364/489 |
| 3,705,409 | 12/1972 | Brayton et al. | 444/1 |
| 4,263,651 | 4/1981 | Donath et al. | 364/300 |
| 4,377,849 | 3/1983 | Finger et al. | 364/491 |
| 4,386,403 | 5/1983 | Hsieh et al. | 364/300 |
| 4,541,067 | 9/1985 | Whitaker | 364/716 |
| 4,566,064 | 1/1986 | Whitaker | 364/300 |
| 4,591,993 | 5/1986 | Griffin et al. | 364/491 |
| 4,695,968 | 9/1987 | Sullivan, II et al. | 364/490 |
| 4,698,760 | 10/1987 | Lembach et al. | 364/490 |
| 4,703,435 | 10/1987 | Darringer et al. | 364/489 |
| 4,725,975 | 2/1988 | Sasaki | 364/491 |
| 4,754,408 | 6/1988 | Carpenter et al. | 364/491 |
| 4,816,999 | 3/1989 | Berman | 364/489 |

OTHER PUBLICATIONS

"The Yorktown Simulation Engine", Monty M. Denneau, IEEE 19th Design Automation Conference, 1982, pp. 55-59.
"Logic Synthesis Through Local Transformation", Darringer et al., IBM Journal of Research and Development, vol. 25, No. 4, Jul. 1981, pp. 272-280.
"Synthesis of Combinational Logic Networks", D. L. Dietmeyer-Logic Design of Digital Systems, Allynt Bacon, Boston, 1978, pp. 156-238.
"Symbolic Manipulation of Boolean Functions Using a Graphical Representation", Randal E. Bryant, IEEE 22nd Design Automation Conference, 1985, pp. 688-693.
"Experiments in Logic Synthesis"; Darringer et al.; pp. 234-237A, IBM, Thomas J. Watson Research Center, Yorktown Heights, New York.
Global Flow Analysis in Automatic Logic Design; Trevillyan et al., RC 10340 (#46137) 1/23/84; Computer Science; pp. 1-16.

Primary Examiner—Parshotam S. Lall
Assistant Examiner—V. N. Trans
Attorney, Agent, or Firm—Sughrue, Mion, Zinn, Macpeak & Seas

[57] ABSTRACT

An apparatus and method for reducing the number of gate levels of a logic network. The gates of the network are levelized in a forward and backward direction to determine the worst path length of the network. A gate in the worst path is selected in accordance with a specified scoring function. A local Boolean compression is applied to the selected gate, thereby reducing the number of gate levels of the logic network.

16 Claims, 5 Drawing Sheets

FIG. 3 LEVELIZATION AND SCORING DATA

| GATE | 1ST INPUT | | | 2ND INPUT | | | OUTPUT | | | CONNECTION COUNT INCREASE | GATE COUNT INCREASE | WORST PATH CONVERGENCE | LONG PATH CONVERGENCE |
| --- | --- | --- | --- | --- | --- | --- | --- | --- | --- | --- | --- | --- | --- |
| | ARRIVAL | REQUIRED | SLACK | ARRIVAL | REQUIRED | SLACK | ARRIVAL | REQUIRED | SLACK | | | | |
| 1 | 0 | -3 | -3 | — | — | — | 1 | -2 | -3 | — | — | 0.5 | 0.25 |
| 2 | 0 | -3 | -3 | — | — | — | 1 | -2 | -3 | — | — | 0.5 | 0.25 |
| 3 | 1 | -2 | -3 | 0 | -2 | -2 | 2 | -1 | -3 | — | — | 0.5 | 0.25 |
| 4 | 0 | -2 | -2 | 1 | -2 | -3 | 2 | -1 | -3 | — | — | 0.5 | 0.25 |
| 5 | 2 | -1 | -3 | 2 | -1 | -3 | 3 | 0 | -3 | 8 | 1 | 1 | 1 |
| 6 | 0 | 0 | 0 | — | — | — | 1 | 1 | 0 | — | — | 0 | 0 |
| 7 | 3 | 0 | -3 | — | — | — | 4 | 1 | -3 | 0 | -1 | 1 | 0.5 |
| 8 | 1 | 1 | 0 | 3 | 1 | -2 | 4 | 2 | -2 | — | — | 0 | 0.5 |
| 9 | 0 | 1 | 1 | 4 | 1 | -3 | 5 | 2 | -3 | 0 | -1 | 1 | 0.5 |
| 10 | 4 | 2 | -2 | 5 | 2 | -3 | 6 | 3 | -3 | 2 | 0 | 1 | 1 |
| 11 | 0 | 3 | 3 | — | — | — | 1 | 4 | 3 | — | — | 0 | 0 |
| 12 | 6 | 3 | -3 | — | — | — | 7 | 4 | -3 | 0 | -1 | 1 | 0.5 |
| 13 | 1 | 4 | 3 | 6 | 4 | -2 | 7 | 5 | -2 | — | — | 0 | 0.5 |
| 14 | 0 | 4 | 4 | 7 | 4 | -3 | 8 | 5 | -3 | 0 | -1 | 1 | 0.5 |
| 15 | 7 | 5 | -2 | 8 | 5 | -3 | 9 | 6 | -3 | — | — | 1 | 1 |

GATES 9 OR 14

GATES 7 OR 12

GATE 10

GATE 5

LOGIC PATH LENGTH REDUCTION USING BOOLEAN MINIMIZATION

TECHNICAL FIELD

The present invention relates to a method and apparatus for reducing the number of gate levels between the input and output of a complex logic network. More particularly, the invention relates to a method and apparatus for reducing the number of gate levels of a complex combinational network having NAND or NOR logic to any value greater than or equal to three levels.

BACKGROUND ART

Various methods and techniques have been used to produce more efficient logic networks by reducing path lengths. The publications "Logic Synthesis Through Local Transformation" by J. A. Darringer et al, IBM J. RES. Develop, Vol. 25, No. 4, July, 1981, at pp. 272–280, and "Experiments in Logic Synthesis", Proceedings of IEEE International Conference on Circuits and Computers ICCC 80, Port Chester, N.Y., 1980, pp. 234–237 A, by J. A. Darringer et al, both discuss a system for synthesizing synchronous combinational logic. In the system, simple local transformations are used to incrementally improve the logic network. The system is primarily directed to reducing the size or number of gates of logic networks, but makes some attempts to reduce path lengths.

The publication "Global Flow Analysis in Automatic Logic Design" by L. Trevillyan et al, R.C. 10340 (No. 46137), July 23, 1984, at pp. 1–16, discusses the applications of global flow optimization techniques to automated design of logic. These techniques utilize linear time algorithms which extend the scope of local optimizations to the entire logic network design. The global flow analysis transforms have options which allow them to decrease path lengths by pushing signals forward in the logic network. The method steps employed in the above cited references are set forth in detail in their respective publications, and are different from the method of the present invention. For example, the logic levels in a sample design having approximately 40 gate levels could not be reduced to below 24 levels of NAND gates using the techniques of the above references. Using the method of the present invention, the network was reduced to 10 levels, with only a 3.33% increase in gates, a 3.14% increase in signals, and a 10.8% increase in connections. Moreover, using the method of the invention, the sample design could have been reduced to three levels.

U.S. Pat. No. 4,263,651 discloses a method of determining critical paths within a logic block circuit having a number of logic blocks interconnected by nets which carry logic signals between the logic blocks. The method includes levelizing the logic blocks and determining the long and short path delays so that the circuit can be redesigned. However, this method does not provide correction, and criticality can be determined only at a register input or network output, not at blocks internal to the logic, since only forward levelization is disclosed.

U.S. Pat. Nos. 4,541,067 and 4,566,064 disclose a method of generating combinational logic networks from PASS transistors for increasing the packing density of the resulting logic networks. However, this method begins with the formation of a truth table which represents the function to be implemented, and therefore does not preserve any structural information from a pre-existing logic network.

U.S. Pat. No. 4,377,849 discloses a multipass process for automatically generating complex circuit designs. In the process, logic cells are broken down into basic components of the logic technology add are assembled into prime cells or macros to complete the circuit design.

U.S. Pat. No. 4,386,403 discloses a system for analyzing complex circuits. In the system, a macromodel of repetitive circuitry is utilized. The system also includes means for determining when a macromodel is "latent" or "quiescent", thereby saving time during the analysis of the circuit when a macromodel is latent.

U.S. Pat. No. 3,622,762 discloses a method of improving circuit operation by changing design variables. The method includes an optimizer routine for receiving an objective function and the function's first derivative. In the optimizer routine, original element values are adjusted to improve a numerical representation of the objective function.

U.S. Pat. No. 3,093,751 discloses an "exclusive or"-'circuit for providing a desired logical result in response to a set of binary inputs.

U.S. Defensive Publication No. T940,020 discloses a method for automatically generating a topology for a logic circuit which will be embodied in a semiconductor wafer. In the method, fixed data, which represent the electrical and topological qualities of each logical element in the logic circuit, are inputted to a computer in the form of an ordered grid array layout. A program generates, for each logical element in the grid array, coordinate data which translate the coordinates into a topological pattern descriptive of the logic circuit.

U.S. Defensive Publication No. T940,013 discloses an automated process for analyzing electrical networks. The process solves a set of node and parameter equations. An "adjoint" equation is solved by weighting each of the "performances", and a sensitivity vector is used to converge on an optimized solution.

U.S Defensive Publication No. T938,005 discloses a process for making LSI chips. The process includes a "design automation" system containing predesigned circuits. The system generates a graphical description of a circuit. The generated description is then merged with a topology from a library to form a complete chip description.

In addition, there are various methods for mapping a logic network. U.S. Defensive Publication Nos. T943,001, T944,001 and T944,008 are cited as examples of such logic mapping methods.

Although the above and various other methods and systems have been used to reduce the path lengths of logic networks, these prior art methods and systems usually require drastic restructuring of the original logic network. Further, these previous methods and systems can reduce gate levels only by a limited amount, or completely compress the logic network into a sum of products form.

SUMMARY OF THE INVENTION

It is thus an object of the present invention to provide a method and apparatus for reducing gate levels of a logic network without drastically restructuring the original network.

It is another object of the invention to provide a method and apparatus which can reduce the number of gate levels to any value greater than, or equal to, three levels. The method and apparatus of the invention accomplish these and other objects by reducing a logic network having a plurality of gates to a specified number of levels. The gates of the network are levelized in a forward and backward direction to determine those gates in a worst path through the logic network. Next, a gate is selected in accordance with a scoring function. A local Boolean compression is then applied to the selected gate, thereby reducing the number of gate levels of the logic network.

BRIEF DESCRIPTION OF THE DRAWINGS

FIG. 3 shows, in table form, the levelization and scoring data according to the invention.

DETAILED DESCRIPTION OF THE PREFERRED EMBODIMENT OF THE INVENTION

Figure 1:
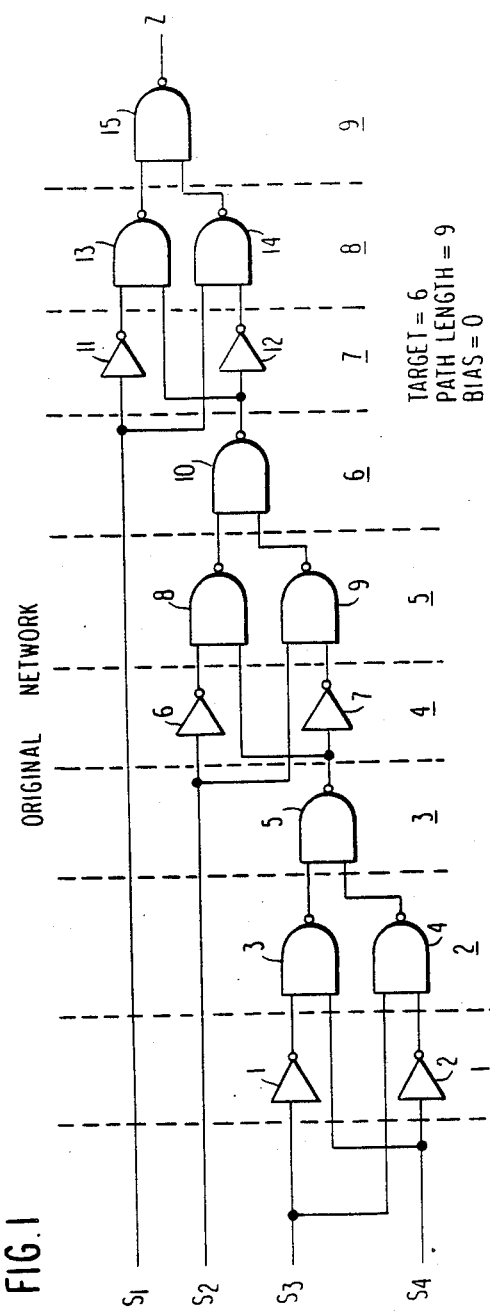
FIG. 1 is a logic circuit diagram of a sample circuit.

Prior to describing the method of the invention, the following terms, which are used in the description, will be defined:

Gate:
The NAND, NOR or inverters comprising the logic network.
Primary Input/Output:
The inputs and outputs of the logic circuit which are external to the circuit (e.g. an input not fed by internal gates of the circuit or an output feeding points external to the logic circuit).
Gate input or Connection:
The input connection of a gate. The first gate input refers to the input connection "above" the second gate input as shown in the drawings. For example, in FIG. 1, the first gate input to gate 5 is the input from gate 3, and the second gate input to gate 5 is the input from gate 4.
Target Number/Target Path Length:
The desired number of gate levels for the logic circuit.
Slack:
The amount by which the maximum path length through some point in the network is exceeded by the target number.
Long path:
A path through the logic network and which is longer than the target path length.
Worst path:
A long path through the logic network from a primary input to a primary output which has the largest number of gate levels.
Primary input bias or Bias:
The amount added to all path lengths calculated from the given primary input. If not specified, zero is used. It is also the arrival time at the primary input.
Arrival time:
The maximum path length from any primary input (adjusted by its "bias" value, if any) to a particular gate input/output.
Primary output target:
The path length required at the specified primary output. If not specified, a global network target path length is used. This is also the required time at the primary output.
Required time:
The minimum path from a given point in the network to any primary output subtracted from the target for that primary output.
Path convergence:
For a set of paths (such as all worst paths in the network), this is a measure of the number of such paths which converge at a specific point in the network.
Trial or Temporary Gate Compression:
This is a Boolean function which has been minimized by a trial algebraic manipulation. Since it is a trial manipulation, no reconstruction of the logic circuit (e.g. eliminating gates, rewiring gate compressions) is actually performed on the logic.
Gate Compression:
This is similar to a temporary compression, with the difference being that the reconstruction is performed (e.g. gates are eliminated and gate connections are rewired).

FIG. 1 shows a logic network having NAND and inverter gates. The logic network has nine levels, and includes fifteen gates, numbered 1-15. Gates 1, 2, 6, 7, 11 and 12 are inverters, and gates 3-5, 8-10 and 13-15 are NAND gates. The logic network also includes four primary inputs $S_1$, $S_2$, $S_3$ and $S_4$, and one primary output Z.

Figure 2:
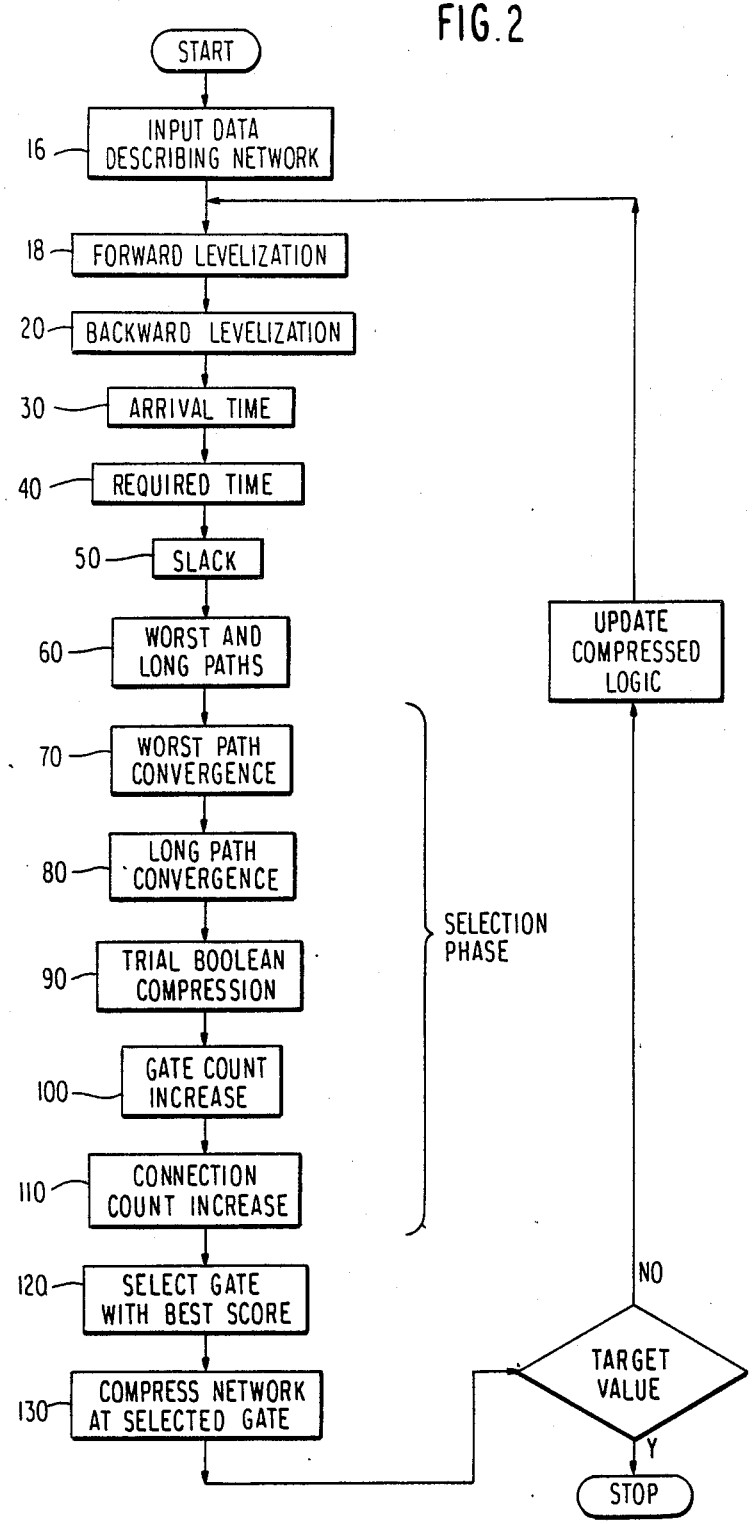
FIG. 2 is a flow diagram of the method steps of the invention.

FIG. 2 shows a flow diagram of the method steps of the invention. The method begins by inputting data representing a logic network or circuit at block 16. The method then proceeds with forward and backward levelization of each gate input/output of the logic network at blocks 18 and 20, respectively. From the forward levelization step, an arrival time for each gate can be determined at block 30. From the backward levelization step, a required time for each gate can be calculated at block 40. At block 50, a slack value for each gate is calculated from the results of blocks 30 and 40. After determining the slack values, the gates in long and worst paths can be determined at block 60.

The flow diagram then proceeds into the selection phase (blocks 70, 80, 90 100 and 110) of the method. At blocks 70 and 80, the worst path and long path convergences are determined, respectively. After determining these two parameters, trial local Boolean compressions are performed at block 90. Once the trial compressions are performed, the gate count and connection count increases can be tabulated at blocks 100 and 110, respectively. Next, the gate with the best score, as determined from the results of blocks 70, 80, 100 and 110, is selected at block 120. After the best gate is selected, the logic network is compressed (block 130) at the selected gate. As indicated by the arrow from block 130, the levels of the compressed logic is then checked to determine whether the target value is reached. If the target value is reached, the gate level reduction method of the invention is completed. On the other hand, if the target value is not reached, the method steps start anew begining with block 18 on the updated compressed logic network. In this manner, the original logic network inputted at block 16 is reduced to the specified target value of gate levels.

The above method steps of FIG. 2 can be implemented in hardware designed specifically for this method, or it can be implemented by providing an appropriate program to a general purpose computer. Those skilled in the art will realize that various steps of the invention can be combined to improve efficiency. For example, the backward levelization step can be combined with the slack, the worst path convergence and the long path convergence calculations. These steps are separated in the flow diagram of FIG. 2 and in the accompanying description in order to simplify the explanation of the invention.

The method steps indicated in the flow diagram of FIG. 2 will now be described in detail, with reference to the logic network of FIG. 1.

As shown in FIG. 2, the first step of the method is to input data which is descriptive of the network's topology. The connections of each circuit element along with the function of each element (e.g. NOR, NAND) are inputted. Those skilled in the art will realize that there are various methods for inputting circuit topology, one of which is disclosed in U.S. Pat. No. 4,386,403. The next two steps of the invention are forward and backward levelization of the logic network. The objective of the levilization steps is to determine, for every gate input in the logic network, by how much the maximum path length through an input connection is exceeded by the target path length. Because the desired target path length in a logic network may not be the same for all paths through the network, the levelization steps can accept either a global target path length for the entire network, or a separate path length target for each primary output of the network. The levelization steps can also accept a "bias" on each of the network primary inputs, which will be used to adjust the path length calculated for any path originating at the primary input.

The levelization of the logic network proceeds as two steps, a forward and a backward levelization of the network. The first step is a forward levelization of the logic. The objective of this step is to generate an "arrival time" at each gate input and output. Forward levelization of the logic network proceeds as follows:

(1) Initialize the primary input arrival times to the input bias value, or zero (0) if none is specified.
(2) Put all the primary inputs in a "current list".
(3) For each signal S in the current list:
  (a) For each gate input I of gate G fed by signal S:
    (i) Set the arrival time at I to the arrival time of S.
    (ii) If any input of G does not have an arrival time set, skip to the next input fed by S.
    (iii) If all inputs of G have an arrival time set, set the arrival time at the output of G to one (1) plus the maximum arrival time at any of the inputs of G, and put the output of G on the pending list.
(4) If the pending list is empty, forward levelization is done.
(5) Move the pending list to the current list, clear the pending list, and return to step 3.

The above method of forward levelization will be better understood in the context of the following description which describes forward levelization of the logic network of FIG. 1.

The logic network of FIG. 1 has four primary inputs, $S_1$, $S_2$, $S_3$ and $S_4$. Since no input bias value is specified for any of the primary inputs in FIG. 1, each of the primary inputs is initialized to zero. The primary inputs are then put in a current list, and primary input $S_1$ is considered. Primary input $S_1$ feed gates 11 and 14. The first input of gate 14 is fed by primary input $S_1$, and the second input of gate 14 is fed by gate 12. Because the second input of gate 14 is not fed by signal $S_1$, only the arrival time at the first input of gate 14 is set at zero (0). Since the second input of gate 14 does not have an arrival time set, it is skipped, and the next input (single input of gate 11) fed by signal $S_1$ is considered. The single input of gate 11 is fed by primary input $S_1$. The arrival time at the input of gate 11 is the set at zero (0). All the inputs to gate 11 now have an arrival time set, and as a result, the arrival time at the output of gate 11 is set to one (1) plus the maximum arrival time at any of the inputs of gate 11. Since the maximum arrival time at the input of gate 11 is equal to zero (0), the output arrival time of gate 11 is equal to one (1). The output of gate 11 is then put on the pending list. Accordingly, the Table in FIG. 3 shows the arrival times of the first input of gate 14 equal to zero (0), the arrival time of the input of gate 11 equal to zero (0), and the output arrival time of gate 11 equal to one (1).

The next input primary signal considered is $S_2$, which feeds gates 6 and 9. Gate 6 has only one input, and it is fed by primary input $S_2$. Gate 9 has two inputs with only the first input being fed by signal $S_2$. Only the arrival time of the first input of gate 9 is set at zero (0) since the second input of gate 9 is fed by gate 7. Because at this time not all the inputs of gate 9 have an arrival time set, the next input, input of gate 6, is considered. Gate 6 has only one input, and it is fed by signal $S_2$. As a result, the arrival time of the input of gate 6 is first set at zero (0), and the arrival time of the output of gate 6 is set at one (1). The output of gate 6 is then put on the pending list. Accordingly, the Table of FIG. 3 shows the arrival time of the first input of gate 9 equal to zero (0), the input of gate 6 equal to zero (0), and the arrival time of the output of gate 6 equal to one (1). The pending list at this time contains the outputs of gates 11 and 6.

The next signal considered is primary input $S_3$. Signal $S_3$ feeds gates 1 and 4. Gate 1 has one input, and gate 4 has two inputs, with only the first input of gate 4 being fed by signal $S_3$. The arrival time of the first input of gate 4 is then set at zero (0). The arrival time of the second input of gate 4 would not be set because it is fed by gate 2, and not signal $S_3$. Since at this time not all the inputs to gate 4 have an arrival time set, the next input, input of gate 1, is considered. The arrival time of the input of gate 1 is set at zero (0), and since all the inputs to gate 1 have an arrival time set, the arrival time of the output of gate 1 is set at one (1) plus the maximum arrival time of any of the inputs of gate 1. Thus, the arrival time of the output of gate 1 is set at one $(1+0=1)$ and the output of gate 1 is put on the pending list. Accordingly, the Table of FIG. 3 shows the arrival time of the first input of gate 4 equal to zero (0), the arrival time of the input of gate 1 equal to zero (0), and the arrival time of the output of gate 1 equal to one (1).

At this time, the pending list contains the outputs gates 11, 6, and 1.

The next signal considered is primary input $S_4$, which feeds gates 2 and 3. Gate 2 has one input, and gate 3 has two inputs, with the second input of gate 3 being fed by signal $S_4$. The arrival time of the second input of the gate 3 is then set at zero (0). Since at this time not all inputs to gate 3 have an arrival time set, the next input fed by $S_4$ is considered. Gate 2 has only one input, and is fed by signal S4. The arrival time of the input of gate 2 is set at zero (0), and the arrival time of the output of gate 2 is set at one (1). The output of gate 2 is then put on the pending list. As shown in the Table of FIG. 3, the arrival time of the second input of gate 3 is equal to zero (0), the arrival time of the input of gate 2 is equal to zero (0), and the arrival time of the output of gate 2 is equal to one (1). The pending list now contains gates 11, 6, 1, and 2. Because at this time the current list is empty, the pending list is moved to the current list, and the pending list is cleared.

The first signal on the current list, the output of gate 11, is now considered. Gate 11 feeds only gate 13. Gate 13 has two inputs, with only the first input being fed by gate 11. Accordingly, the arrival time of the first input of gate 13 is set at one (1), the output arrival time of gate 11. Since the second input of gate 13 is not fed by gate 11, the next signal (the output of gate 6) on the current list is considered. Gate 8 has two inputs, with only the first input being fed by gate 6. As a result, the arrival time of the first input of gate 8 is set at zero (0) (the arrival time of the output of gate 6). Since the second input of gate 8 is not fed by gate 6, the next signal (the output of gate 1), on the current list is considered. Gate 1 only feeds the first input of gate 3. Accordingly, the arrival time of the first input of gate 3 is set at one (1), which is the output arrival time of gate 1. At this time, all of the inputs of gate 3 have an arrival time set. As a result, the arrival time of the output of gate 3 is set to one (1) plus the maximum of any input of gate 3. The first input of gate 3 has an arrival time equal to one (1), and the second input of gate 3 has an arrival time equal to zero (0). Thus, the arrival time of the output of gate 3 is equal to two (2), and the output of gate 3 is put on the pending list. Accordingly, the Table of FIG. 3 shows the arrival time of the first input of gate 3 equal to one (1), and the arrival time of the output of gate 3 equal to two (2). The next signal (the output of gate 2), on the current list is then considered. Gate 2 feeds gate 4, which has two inputs. The first input of gate 4 already has an arrival time equal to zero. The second input of gate 4 is fed by gate 2. The arrival time of the second input of gate 4 is then set at one (1) (the output arrival time of gate 2). The arrival time of the output of gate 4 is set at two (2) since the maximum arrival time of any input to gate 2 is one (1). Gate 2 is then put on the pending list. Accordingly, the Table of FIG. 3 shows the arrival time of the second input of gate 4 equal to one (1), and the arrival time of the output of gate 4 equal to two (2). The pending list, which now contains gates 3 and 4, is then moved to the current list, and the pending list is cleared.

In a similar manner, the arrival times for the remaining gate inputs/outputs are calculated. The values of these remaining arrival times are shown in the Table of FIG. 3.

The next step of the invention is backward levelization of the logic network. The objective of backward levelization is to generate a "required" time at each gate input and output. Backward levelization of the logic network proceeds as follows:

(1) Initialize the primary output required times to the primary output target number for that primary output, or the global path length target if none is specified.
(2) Put all the gates feeding primary outputs in the current list.
(3) For each gate G in the current list:
   (a) For each gate input I of gate G:
      (i) Set the required time at I to the required time at the output of G minus one (1).
      (ii) If any gate input fed by the signal feeding I does not have a required time set, skip to the next input of G.
      (iii) If all gate inputs fed by the signal feeding I have a required time set, set the required time of the signal feeding I to the minimum required time at any of the gate inputs it feeds, and put the gate which feeds I on the pending list.
(4) If the pending list is empty, backward levelization is done.
(5) Move the pending list to the current, clear the pending list, and return to step 3.

The backward levelization step of the invention will be better understood in the context of the following description which describes backward levelization of the logic network of FIG. 1.

As shown in FIG. 1, the target output value for the logic network is six (6). Accordingly, the output required time of gate 15 is set at six (6). Gate 15, which has two inputs, is then placed on the current list since it is the only gate feeding primary output Z. The required time of each of these inputs is then set at the output arrival time of gate 15 minus one (1). The Table in FIG. 3 shows the first and second inputs of gate 15 each having a required time equal to five $(6-1=5)$. The required time of the output of gates 13 and 14 are then set to five (5) since these gates feed gate 15, and both inputs to gate 15 have a required time of five (5). Gates 13 and 14 are then put on the pending list. Next, the pending list is moved to the current list, and the pending list is cleared. The first gate on the pending list (gate 13) is then considered. The required time for the two inputs of gate 13 are set at four (4) since the required time of the output of gate 13 is set at five (5). Since the first input of gate 13 is fed by gate 11, which does not feed any other gates, the required time of the output of gate 11 is also set at four (4). However, the second input of gate 13 is fed by gate 10 which also feeds gate 12. At this time, gate 12 does not have a required time set, and therefore the required time of the output of gate 10 is skipped. Gate 11 which feeds the first input of gate 13 is then put on the pending list.

Gate 14, which has two inputs, is then considered. The required times of these two inputs are set at four (4) because the output required time of gate 14 is equal to five (5). The output required time of gate 12 which feeds the second input of gate 14, is then set at four (4) since it is the only gate which feeds gate 14, and since gate 14 has a required time set. Gate 12 is then put on the pending list. The pending list which now contains gates 11 and 12, is then moved to the current list, and the pending list is cleared.

Gate 11 has one input signal $S_1$. The required time of the input of gate 11 is set at three (3) because the required time of the output of gate 11 is equal to four (4).

Since the primary input $S_1$, rather than a gate feeds gate 11, no gate is put on the pending list. Gate 12, which has one input, is then considered. The required time of the input of gate 12 is set at three (3) since the output required time of gate 12 is equal to four (4). Gate 12 is fed by gate 10 which also feeds the second input of gate 13. Since at this time both gates 13 and 10 have required times set, the required time of the output of gate 10 is set at the minimum required time of any of the gate inputs it feeds. The required time of the second input of gate 13 is equal to four (4), and the required time of the input of gate 12 is equal to three (3). As a result, the required time of the output of gate 10 is equal to three (3).

In a similar manner, the required times of the inputs/outputs for the remaining gates can be calculated. The required time values for gates 1-15 are shown in the Table of FIG. 3.

As shown in the flow diagram of FIG. 2, the next step of the invention is to calculate the "slack" of each gate input and output. The slack is calculated by subtracting the arrival time of each gate input/output from the required time of each gate input/output. For example, the single input of gate 1 has a required time equal to negative three ($-3$), and an arrival time equal to zero (0). The slack value of the input of gate is equal to negative three ($-3-0=-3$). The slack values for gates 1-15 are indicated in the Table of FIG. 3. Once the slack of each gate is calculated, those gates in the "worst path" and the "long path" can be determined. More specifically, all gates which have a negative slack value are in long paths, and all gates which have the most negative slack value are in worst paths. In FIG. 3, the most negative slack value indicated is negative three ($-3$). Accordingly, all gate inputs and outputs having a slack value of negative three ($-3$) are in a worst path.

Figure 4:
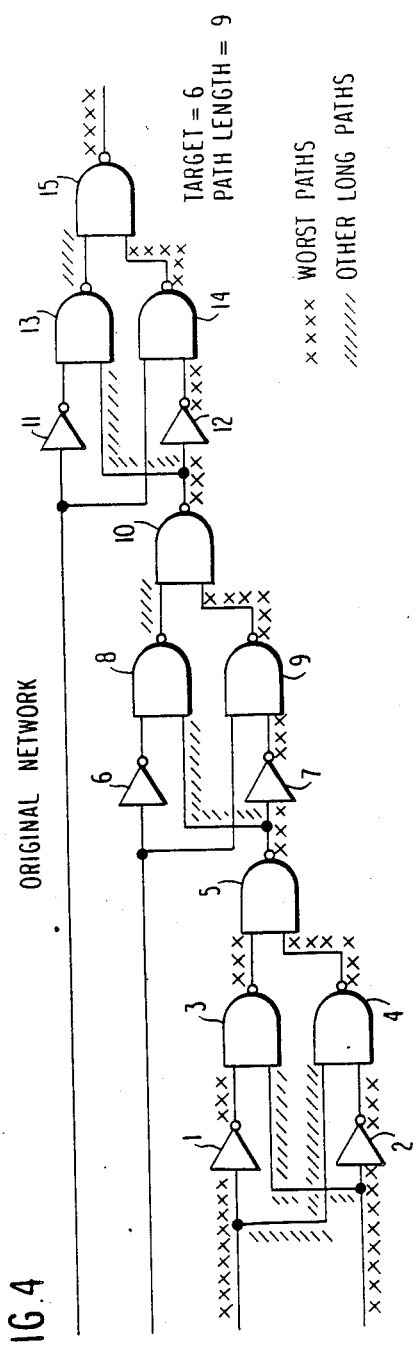
FIG. 4 is a logic circuit diagram indicating the long and worst long paths of the circuit in FIG. 1.

FIG. 4 shows the logic network of FIG. 1 with a worst path indicated by the symbol *. For example, the first and second inputs of gate 5, the input of gate 7 and the second input of gate 9 each have a slack value of negative three ($-3$) as shown in the Table of FIG. 3. Accordingly, these inputs are in a worst path, and are indicated by the symbol * in FIG. 4.

A long path exists through those inputs and outputs of the logic network which have a negative slack value, but are not equal to negative three ($-3$). FIG. 4 shows a long path indicated by the symbol ///. Accordingly, each of the inputs and outputs indicated by symbol /// have a slack value of either negative one ($-1$), or negative two ($-2$), as shown in the Table of FIG. 3.

The next step in the flow diagram of FIG. 2 is to calculate the "worst path convergence" of each gate. The worst path convergence factor or value is an approximate measure of how many paths would be fixed by compressing at a particular gate. The worst path convergence value is important because if several worst paths converge at a single gate, compressing that one gate can shorten all of the converging paths. Otherwise, several gates, one in each of the converging paths, would have to be compressed. The worst path convergence factor is calculated by the following method:

(1) Set the convergence factor for each gate feeding a worst path primary output to one (1), and set the convergence factor for all gates not in worst paths to zero (0).
(2) Put all the gates feeding worst path primary outputs in the current list.
(3) For each gate G in the current list:
   (a) For each gate input I of gate G: (i) Set the convergence factor at I to the convergence factor of G divided by the number of inputs to G which are in worst paths; if I is not in a worst path set the convergence factor at I equal to zero (0).
   (ii) If any gate fed by the signal feeding I does not have a convergence factor set, skip to the next input of G.
   (iii) If all gates fed by the signal feeding I have a convergence factor set, set the convergence factor of the gate feeding I to the sum of the convergence factors at all the gate inputs it feeds, and put the source gate which feeds I on the pending list.
(4) If the pending list is empty, convergence calculation is done.
(5) Move the pending list to the current list and clear the pending list.

The above method of determining the worst path convergence factor will be better understood in the context of the following description which describes the method of calculating the worst path convergence factor for each gate in the logic network of FIG. 1.

Since there is only one primary output Z, which is the output of gate 15, gate 15 has a worst path convergence factor equal to one (1). Gate 15, which has two inputs, is then put on the current list. The first input of gate 15, which is fed by gate 13, has a worst path convergence factor equal to zero (0) because it is not in a worst path. Similarly, gates 6, 8, 11, and 13 have worst path convergence factors equal to zero (0) because these gates are not in worst paths (FIG. 4). The second input of gate 15, which is fed by gate 14, has a worst path convergence factor set at the worst path convergence factor of the output of gate 15 divided by the number of inputs to gate 15 which are in worst paths. As indicated in FIG. 4, only one input of gate 15 is in a worst path. Thus, the second input of gate 15 has a worst path convergence factor equal to one ($1 \div 1 = 1$). Since gate 15 has a worst path convergence factor set, the worst path convergence factor of gate 14 is set at the sum of the worst path convergence factors of all the gate inputs it feeds. Gate 14 only feeds the second input of gate 15, and therefore has a worst path convergence factor equal to one (1). Gate 14 is then put on the current list via the pending list, and the pending list is cleared.

Gate 14 has two inputs, with only the second input of gate 14 being in a worst path. The worst path convergence factor at the second input of gate 14 is then set to the worst path convergence factor of gate 14 divided by the number of inputs of gate 14 which are in worst paths. Since only one input to gate 14 is in a worst path, and since the worst path convergence factor of gate 14 is set at one (1), the worst path convergence factor of the second input of gate 14 is equal to one (1). At this time, all of the gates fed by the second input of gate 14 have a worst path convergence factor set (e.g. gate 14 is set). As a result, the worst path convergence factor of gate 12, which feeds the second input of gate 14, is set to the sum of the worst path convergence factors at all of the gates it feeds. Since gate 12 only feeds the second input of gate 14, gate 12 has a worst path convergence factor equal to one (1), which is the worst path convergence factor of the second input of gate 14. Gate 12 is then put on current list via the pending list, and the pending list is cleared.

Gate 12 has one input which is in a worst path. The convergence factor of the input of gate 12 is set at the convergence factor of gate 12 divided by the number of inputs to gate 12 in a worst path. Since there is one input to gate 12 in a worst path, the convergence factor of the input to gate 12 is equal to one (1). Gate 10, which feeds gate 12, also feeds the second input of gate 13, and gate 13 has a worst path convergence factor set. As a result, the worst path convergence factor of gate 10 is equal to the sum of all the worst path convergence factor inputs it feeds. Since the second input of gate 13 has a worst path convergence factor equal to zero (0), gate 10 has a worst path convergence factor set at one $(1+0=1)$. Gate 10 would then be put on the current list via the pending list.

In a similar manner, the worst path convergence factors of the remaining gates are calculated. For example, FIG. 3 shows that gate 5 has a worst path convergence factor equal to one (1). Gate 5 has two inputs, both of which are in worst paths. Accordingly, the gates which feeds gate 5, gates 3 and 4, have a worst path convergence factor equal to one-half ($\frac{1}{2}$). The worst path convergence factors of the remaining gates are shown in the Table of FIG. 3.

The next step in the flow chart of FIG. 2 is to calculate the long path convergence factor at each of the gates. The long path convergence factor is calculated in a similar manner to the calculation of the worst path convergence factor indicated above. However, in calculating the long path convergence factor, all long and worst paths are considered rather than just the worst paths. The following description will describe the method of calculating the long path convergence factors of each of the gates in the logic network of FIG. 1.

The long path convergence factor of each primary output is set to one (1) if the output is in a long path, and the long path convergence factor for each gate not in a long path is set to zero (0). As shown in FIG. 4, gates 6 and 11 are not in worst paths or long paths. As a result, each of these gates has a long path convergence factor equal to zero (0). The primary output Z, which is fed by gate 15, is in a long path so gate 15 has a long path convergence factor equal to one (1). Gate 15 is then put on the current list via the pending list. Gate 15 has two inputs, with each of these inputs having a long path convergence factor set to the long path convergence factor of gate 15 divided by the number of inputs to gate 15 which are in long paths. As shown in FIG. 4, both inputs of gate 15 are in long paths. As a result, the two inputs of gate 15 each have a long path convergence factor equal to one-half $(1 \div 2 = \frac{1}{2})$. Since each of the two inputs of gate 15 only feeds gates 15, each of the long path convergence factor of gates 13 and 14 is equal to one-half ($\frac{1}{2}$). Gates 13 and 14 are then put on the current list via the pending list, and the pending is cleared.

Gates 13 and 14 each have two inputs and each have one input in a long path. The convergence factor at each of these inputs of gate 13 and 14 is set at one-half ($\frac{1}{2}$), which is the long path convergence factor of gates 13 or 14 divided by the number of inputs in long paths. The second input of gate 13 is fed by gate 10 which also feeds gate 12. Since at this time gate 12 does not have a long path convergence factor set, the long path convergence factor of gate 10 is skipped. The second input of gate 14 is fed by gate 12 which does not feed any other gates. As a result, the convergence factor of gate 12 is set to one-half ($\frac{1}{2}$) which is equal to the long path convergence factor of the second input of gate 14 divided by the number of inputs of gate 14 in long paths. Gate 12 is then put on the current list via the pending list, and the pending list is cleared.

Gate 12 has one input whose long path convergence factor is set to one-half ($\frac{1}{2}$), the long path convergence factor of gate 12 divided by the number of inputs to gate 12 in long paths. Gate 10 feeds the input of gate 12 and the second input of gate 13. Since each of gates 13 and 12 has a long path convergence factor set, the long path convergence factor of gate 10 is set at the sum of the long path convergence factors at all the gate inputs it feeds. The second input of gate 13 has a long path convergence factor of one-half ($\frac{1}{2}$), and the input of gate 12 has a long path convergence factor of one-half ($\frac{1}{2}$). As a result, the long path convergence factor of gate 10 is equal to one ($\frac{1}{2}+\frac{1}{2}=1$). In a similar manner, the long path convergence factors of the remaining gates can be calculated. The long path convergence factor of gates 1–15 are shown in FIG. 3.

The next step in the flow chart of FIG. 2 is to perform "temporary" or "trial" gate compressions. In general, gate compressions are performed by distributing the inputs of gates two levels back from a selected gate forward two levels across copies of the selected gate. This compression can be performed for any NAND/NOR gate in a NAND/NOR logic network which is at least two levels from the inputs, and at least one level from the outputs. A gate compression is performed by: obtaining a selected gate, applying De Morgen's Law to the input and output gates of the selected gates, applying the distributive property and then applying De Morgen's Law again.

Figure 5:
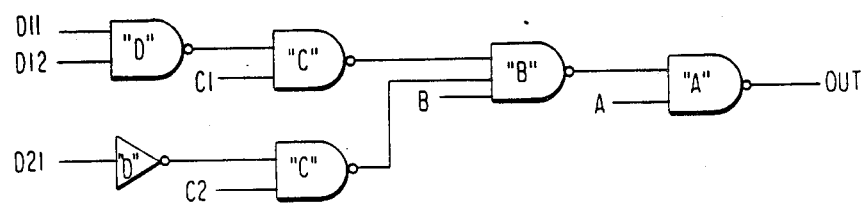
FIG. 5 is a logic circuit diagram of a circuit used to show the local Boolean compression step of the invention.

FIG. 5 shows a simple logic network containing "A", "B", "C" and "D" gates. In FIG. 5, gate "B" would be the selected gate since the compression can only be performed for a gate which is at least two levels from the inputs, and at least one level from the outputs. As shown in FIG. 5, gate "B" is the only gate in the network which is at least one level from the output and at least two levels from the input. The "A" gates are those gates fed by the "B" gate. In general, there may be more than one "A" gate, although only one appears in FIG. 5. The "C" gates are those gates which are in worst paths and whose outputs feed the "B" gate. The "D" gates are those gates which are in worst paths and whose output feed the "C" gates.

The Boolean equation for the output of the logic network of FIG. 5 is ('&' = AND), ('+' = OR) and ('−' = complement):
OUT = $-(A \& -(B \& -(C1 \& -(D11 \& D12)) \& -(C2 \& -D21))$
Apply De Morgen's law to the "A" and "C" gates gives:
OUT = $-A + (B \& (-C1 + (D11 \& D12)) \& (-C2 + D21))$
Distributing "B" over C1, and then over C2 gives:
OUT = $-A + (B \& -C1 \& -C2) + (B \& D11 \& D12 \& -C2) +$ $(B \& -C1 \& D21) + (B \& D11 \& D12 \& D21)$ Finally, applying De Morgen's law again gives:
OUT =

$-(A \& -(B \& -C1 \& -C2) \& -(B \& D11 \& D12 \& -C2) \&$ $-(B \& -C1 \& D21) \& -(B \& D11 \& D12 \& D21)$

Figure 6:
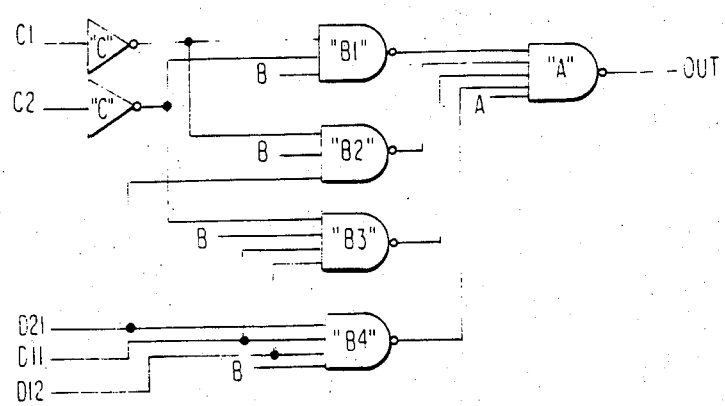
FIG. 6 is a logic circuit diagram of the resulting circuit after the local Boolean compression step of the invention is applied to the circuit of FIG. 5.
Figure 7A:
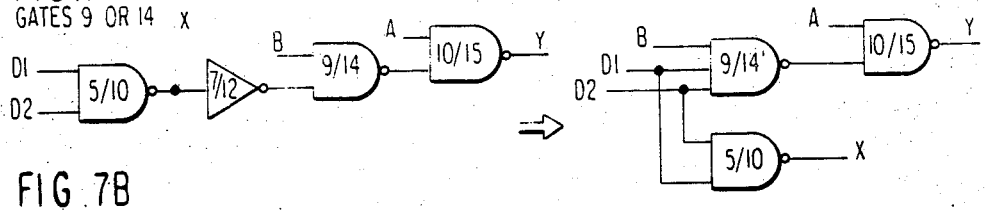
FIGS. 7A-7D show logic circuit diagrams in accordance with the trial local Boolean compression step of the invention.
Figure 7B:
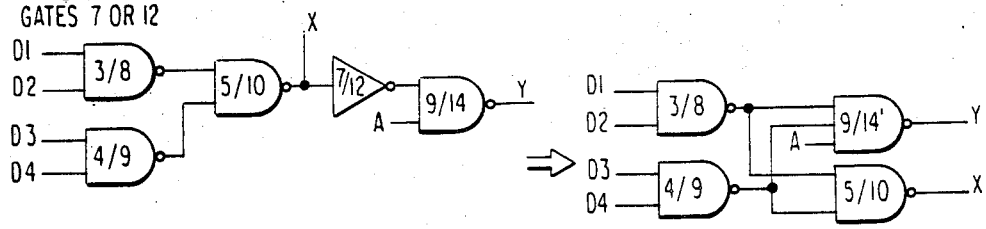
Figure 7C:
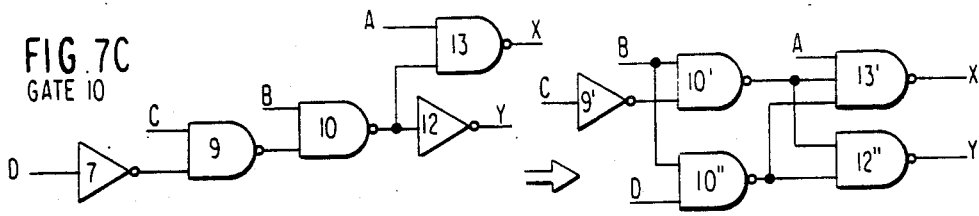
Figure 7D:
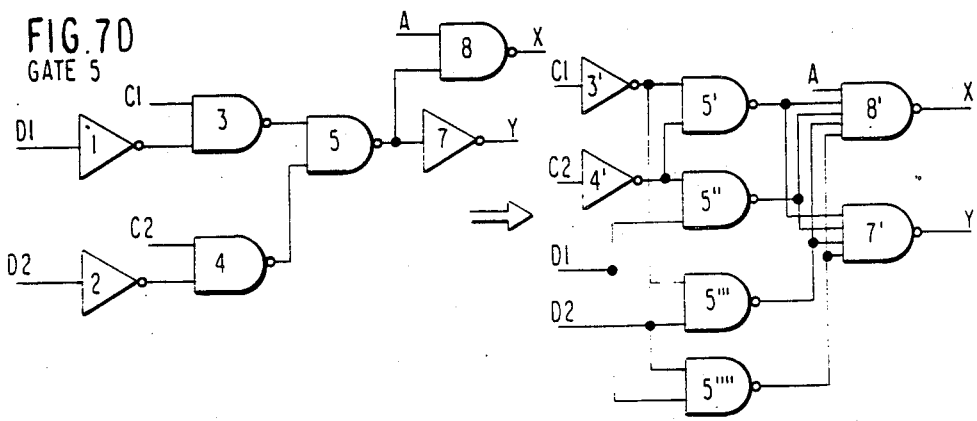

The resulting logic network, after the compression is performed on gate "B", is shown in FIG. 6. The inputs D11, D12 and D21 are shown to have been brought forward two levels to a copy of the selected "B" gate. Although in the particular logic network of FIG. 5 it was obvious that gate "B" would be selected for compression, in most complex logic networks there are in fact many gates which may be selected for compression. In such complex logic networks, those gates with non-zero worst path convergence factors (e.g. some worst paths converge at the gate) and which are at least one level from the outputs and at least two levels from the inputs would be selected. For example, in FIG. 3, gates 5, 7, 9, 10, 12 and 14 would be chosen for trial compressions since these gates have non-zero worst path convergence factors, and are at least one level from the output and at least two levels from the inputs. Gates 6, 11 and 13 would not be selected since each of these gates have a worst path convergence factor equal to zero. Gates 1–4, 11 and 13 would not be selected since these gates are within two levels from inputs. Gate 15 would not be selected since it is within one level of the output. FIGS. 7A–7D show portions of the logic network of FIG. 1 before and after a trial compression is performed on the selected gates 5, 7, 9, 10, 12 and 14.

After performing the trial compressions on the selected gates, the connection count increase and the gate count increase steps of the invention can be calculated. The gate count increase value G is determined by subtracting the number of gates in the logic after a local Boolean compression is performed from the number of gates in the logic before the compression is performed. The connection count increase value C is determined by substracting the number of gate inputs or connections in the logic before the compression is performed from the number of connections after the compression is performed. For example, in FIG. 7A, trial Boolean compressions were performed on gates 9 and 14. Before the trial compression, four gates are shown having seven inputs or connections. After the trial compression, three gates are shown having seven connections. As a result, gates 9 and 14 each have a gate count increase of negative one $(3-4=-1)$, and a connection count increase of zero $(7-7=0)$.

In a similar manner, the connection count increase and the gate count increase for the remaining selected gates 7, 12, 5 and 10 can be calculated. The connection count increase and the gate count increase values for the selected gates are shown in the Table of FIG. 3.

Figure 8:
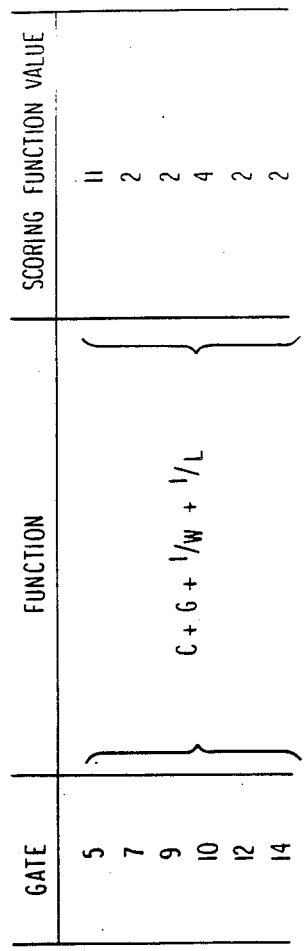
FIG. 8 is a table showing the values of a scoring function according the scoring step of the invention.
Figure 9:
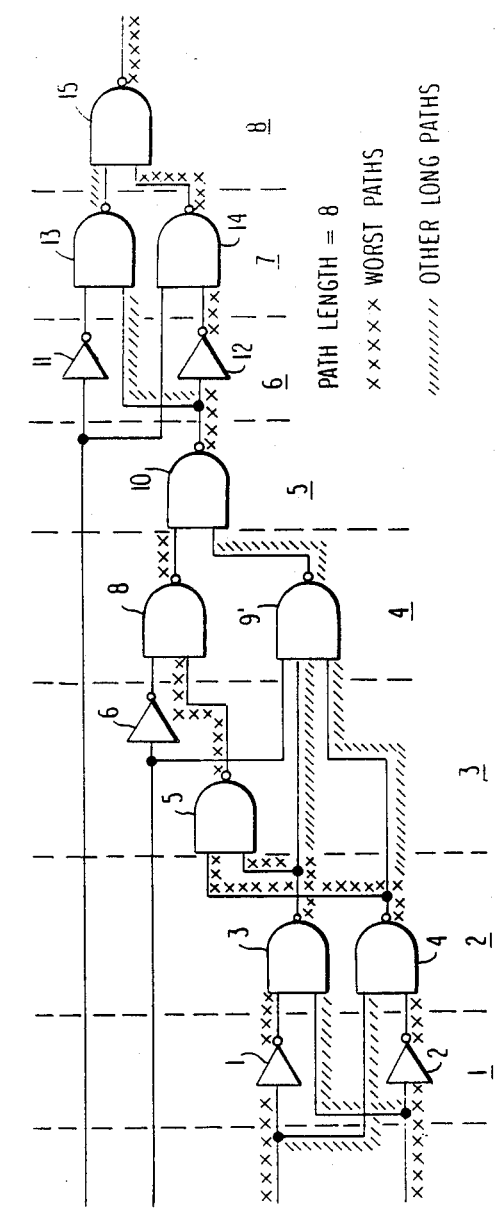
FIG. 9 is a logic circuit diagram of a reduced circuit according to the local Boolean compression step of the invention.

The next two steps in the flow diagram of FIG. 2 are to select the gate with the best score, and to compress the logic network at that gate. In calculating the best score, the connection count increase C, the gate count increase G, the worst path convergence factor W and the long path convergence factor L are all considered. More particularly, one or more of these four factors are weighted according to a user's specification to determine a scoring function. For example, a scoring function of $C+G+1/W+1/L$ can be specified with the gate having the lowest scoring value being the gate with the best score. FIG. 8 shows the scoring function value for each of the gates chosen for a temporary compression (block 90 of FIG. 2). Using this scoring function, any one of gates 7, 9, 12 or 14 would be selected for compression (block 130 of FIG. 2) since each of these gates have the lowest scoring value (2) For example, gate 9 could be selected for compression. FIG. 9 shows the resulting compressed logic network of FIG. 1 after a gate compression at gate 9 is performed. The Boolean compression at gate 9 results in a path length reduction of one level, from nine levels to eight levels.

In reference to FIG. 2, the compressed logic network would then be checked to determine if the target value was reached. If the target value was reached, the logic network would be compressed to the desired number of gate levels, and the method would be completed. On the other hand, if the target value was not reached, the method steps of the invention would be performed again, starting with forward levelization of the compressed logic network until the target value was obtained. Since the logic network of FIG. 9 still has eight levels after a compression was performed, the steps of the invention would be repeated, starting with forward levelization of the compressed network FIG. 9. This process would continue until the logic network was reduced to six levels.

In summary, the method of the invention is capable of reducing path lengths to any value, which is greater than or equal to three (3), in all combinational networks of NAND or NOR logic. In addition, the invention reduces path lengths to a selected value without totally restructuring the logic by only compressing at selected points in the logic.

Finally, the invention uses a selection criteria to minimize the increase in network size resulting from the path length reduction.

While a particular embodiment of the invention has been described above, those skilled in the art will understood that various modifications to the invention can be made. It should be understood that the invention is only limited by the scope of the following claims:

I claim:

1. A method for reducing a logic network to a specified number of gate levels, the logic network having a plurality of gates, a number of gate levels, at least one input, at least one output, and at least one worst path which represents a path through the logic network having at least as many gate levels as any other path through the logic network, the method comprising the steps of:
   receiving data representing the topology of the logic network;
   levelizing the gates of the logic network in a forward and a backward direction;
   determining all of the gates of the logic network which are in the at least one worst path;
   specifying a scoring function;
   selecting, in accordance with the scoring function, one of the gates in the at least one worst path;
   applying a local Boolean compression to the selected gate, thereby producing a compressed logic network having fewer gate levels than the number of gate levels of the logic network prior to compression;
   comparing the number of gate levels of the compressed logic network with the specified number of gate levels; and if the compressed logic network has a number of gate levels which is greater than the specified number of gate levels, then
   repeating said levelizing, determining, specifying, selecting, applying, and comparing steps on the compressed logic network until the specified number of gate levels is achieved.

2. The method according to claim 1, wherein the selected gate is at least two levels from the at least one input and at least one level from the at least one output.

3. The method according to claim 1, further comprising the step of: determining those gates of the logic network in a long path which represents a path through the logic network having more than the specified number of gate levels.

4. The method according to claim 1, further comprising the step of: calculating for each of the gates a long path convergence factor which represents a number of paths through the logic network having more than the specified number of gate levels which converge at a particular gate.

5. The method according to claim 1, further comprising the steps of: determining for each of the gates of the logic network an arrival time which represents the maximum path length from the at least one input to a particular gate; and determining for each of the gates of the logic network a required time which represents the minimum path length from the at least one output to a particular gate.

6. The method according to claim 5, further comprising the step of: calculating for each of the gates of the logic network a slack value which represents a difference between the required time and the arrival time.

7. The method according to claim 1, further comprising: calculating for each of the gates a worst path convergence factor which represents a number of worst paths which converge at a particular gate.

8. The method according to claim 7, further comprising the step of: applying a trial local Boolean compression on those gates of the logic network having a worst path convergence factor greater than zero and which are at least two levels from the at least one input and at least one level from the at least one output.

9. The method according to claim 8, further comprising the step of: calculating a gate count increase value which represents a number of gates added to the logic network after said trial local Boolean compression is applied.

10. The method according to claim 8, further comprising the step of: calculating a connection count increase value which represents a number of input connections added to the logic network after said trial Boolean compression step is applied.

11. A method for reducing a logic network to a specified number of gate levels, the logic network having a plurality of gates, a number of gate levels, at least one input, at least one output, and at least one worst path which represents a path through the logic network having at least as many gate levels as any other path through the logic network, the method comprising the steps of:

receiving data representing the topology of the logic network;

levelizing the gates in a forward and backward direction;

calculating for each of the gates a worst path convergence factor which represents a number of worst paths which converge at a particular gate;

calculating for each of the gates a long path convergence value which represents a number of paths through the logic network having more than the specified number of gate levels which converge at a particular gate;

applying a trial local Boolean compression on those gates of the logic network having a worst path convergence factor greater than zero and which are at least two levels from the at least one input and at least one level from the at least one output;

calculating a gate count increase value which represents a number of gates added to the logic network after said trial local Boolean compression is applied;

calculating a connection count increase value which represents a number of input connections added to the logic network after said trial Boolean compression is applied;

specifying a scoring function;

selecting, in accordance with the scoring function, one of the gates in the at least one worst path;

applying a local Boolean compression to the selected gate, thereby producing a compressed logic network having fewer gate levels than the number of gate levels of the logic network prior to compression;

comparing the number of gate levels of the compressed logic network with the specified number of gate levels; and if the compressed logic network has a number of gate levels which is greater than the specified number of gate levels, than repeating said levelizing, worst path convergence factor calculating, long path convergence value calculating, trial Boolean compression applying, gate count increase calculating, connection count increase calculating, specifying, selecting, local Boolean compression applying, and comparing steps on the compressed logic network until the specified number of gate levels is achieved.

12. The method according to claim 11, wherein said scoring function is a function of at least one of the worst path convergence factor, gate count increase value, the long path convergence factor, and the connection count increase value.

13. The method according to claim 11, further comprising the steps of:

determining for each of the gates of the logic network an arrival time which represents the maximum path length from the at least one input to a particular gate; and determining for each of the gates of the logic network, a required time which represents the minimum path from the at least one output to a particular gate.

14. The method according to claim 13, further comprising the step of: calculating for each of the gates a slack value which represents the difference of the required time minus the arrival time.

15. The method according to claim 14, wherein those gates having the most negative slack values are in worst path.

16. The method according tro claim 15, wherein those gates having negative slack values which are more positive than the most negative slack values are in long paths.

* * * * *